(12) United States Patent
Cortner et al.

(10) Patent No.: US 6,513,137 B1
(45) Date of Patent: Jan. 28, 2003

(54) TEST METHOD AND APPARATUS USING ENERGY CONSUMPTION RATIO

(75) Inventors: J. Max Cortner, Inver Grove Heights, MN (US); Bapiraju Vinnakota, Fremont, CA (US); Wanli Jiang, St. Paul, MN (US)

(73) Assignees: Cardiac Pacemakers, Inc., St. Paul, MN (US); Regents of the University of Minnesota, Minniapolis, MN (US)

( * ) Notice: Subject to any disclaimer, the term of this patent is extended or adjusted under 35 U.S.C. 154(b) by 0 days.

(21) Appl. No.: 09/420,011

(22) Filed: Oct. 18, 1999

(51) Int. Cl.[7] .................... G01R 31/28; G06F 11/00
(52) U.S. Cl. ................ 714/736; 714/738; 714/819
(58) Field of Search ..................... 714/738, 741, 714/819, 736

(56) References Cited

U.S. PATENT DOCUMENTS

| | | | | |
|---|---|---|---|---|
| 5,029,171 A | * | 7/1991 | Lee et al. ............... | 714/744 |
| 5,377,201 A | * | 12/1994 | Chakradhar et al. ........ | 714/741 |
| 5,586,125 A | * | 12/1996 | Warner ................... | 714/738 |
| 5,642,362 A | * | 6/1997 | Savir .................... | 714/726 |
| 5,657,240 A | * | 8/1997 | Chakradhar et al. .......... | 716/4 |
| 5,815,416 A | * | 9/1998 | Liebmann et al. ............ | 703/18 |
| 6,169,960 B1 | * | 1/2001 | Ehrichs ................... | 702/36 |
| 6,237,117 B1 | * | 5/2001 | Krishnamoorthy .......... | 714/724 |

FOREIGN PATENT DOCUMENTS

JP 07248360 A * 9/1995 ....... G01R/31/3183

OTHER PUBLICATIONS

Vinnakota, B.; Monitoring power dissipation for fault detection; Proceedings of 14th VLSI Test Symposium, 1996, Pp.: 483–488.*

* cited by examiner

*Primary Examiner*—Albert Decady
*Assistant Examiner*—Joseph D. Torres
(74) *Attorney, Agent, or Firm*—Schwegman, Lundberg, Woessner & Kluth, P.A.

(57) ABSTRACT

A method of fault testing an electronic circuit by measuring the ratio of the power drawn by a circuit under test to the average power drawn by good circuits as the input is driven by input vectors $V_1$ and $V_2$. Input vectors $V_1$ and $V_2$ can be selected in accordance with an algorithm to maximize the difference in power drawn by the faulty circuit relative to the good circuit. The method is useful in detecting redundant logic faults that are not detected at the outputs of the circuit being tested.

25 Claims, 6 Drawing Sheets

TEST METHOD AND APPARATUS USING ENERGY CONSUMPTION RATIO this invention was made with government support under MIP-9502240 and MIP-9501499 awarded by the National Science Foundation. The government has certain rights in this invention.

TECHNICAL FIELD

The present invention relates to the field of testing of integrated circuits. More specifically, the invention relates the testing of integrated logic circuits to detect redundant faults that are not observable on the logic static outputs of the circuits.

BACKGROUND

Traditional test methods often detect the presence of faulty electronic circuits by observing the response of circuit output logic values to various inputs. Such traditional methods do not always provide adequate identification of circuits in which defects exist, particularly where the defects are located at points in the circuit where the output signals do not reveal the existence of these defects, for example, redundant faults.

In order to address the problems noted with the output logic based test methods, delay test methods were developed to measure the speed of the output response. Unfortunately delay test methods also do not detect faults that are logically redundant.

Dynamic test methods also exploit circuit delays to detect faults, including some that are redundant. However these test techniques are dependent on possessing accurate delay models for the circuit being tested so that implementation of the tests is arduous and expensive.

Another collection of test techniques has been developed for testing circuits by the measurement of the supply current consumed by the circuits. A variety of these tests are known as $I_{ddt}$ test methods.

One variant of the $I_{ddt}$ approach involves the application of pulses to the supply rails and measurement of the transient response of the circuit.

A second variant of the $I_{ddt}$ approach is to measure the current drawn by either individual gates or by small collections of gates that make up the electronic circuit.

A third approach is to measure the supply current transients for the entire circuit in response to input changes.

The methods used to monitor the supply current transients may also be varied. The direct approach is to measure each individual transient, perhaps combined with spectral analysis. Another approach is to measure the average current over several transitions.

Each test approach has its own advantages. Methods which measure current consumption for small groups of gates, rather than the entire circuit, provide more information, but are more expensive than conventional output logic based testing. Individual transient measurements may provide more information than average currents but they are harder to measure, especially in high speed circuits.

All of these test measurements are affected by process variations between otherwise acceptable circuits as they are manufactured. Because of the process variations, the currents consumed by a perfect fault-free circuit may vary substantially. In general, it can be shown that the percentage impact of process variations is greater for individual transients measured for small collections of gates than for average currents measured for large collections of gates.

Therefore, a need exists for a method and apparatus that allows for an identification of flawed circuits containing combinationally redundant faults, without being subject to impact of process variations in the manufacturing of the electronic circuits.

SUMMARY

Those skilled in the art, upon reading and understanding the present specification, will appreciate that the present test technique satisfies the aforementioned needs in the art and several other needs not expressly mentioned herein. A method and apparatus for testing an electronic circuit is provided. This method includes connecting the circuit to a power supply, applying input vectors $V_1$ and $V_2$ as inputs to the circuit repeatedly in alternation at a frequency f, and measuring the average energy consumed by the circuit in undergoing repetitive transitions from a first input vector to a second input vector. It also provides for calculating the energy consumption ratio of the measured energy consumed on the energy test by the circuit being tested to the energy consumed on the benchmark transition by the same circuit and identifying the circuit being tested as faulty where its energy consumption ratio differs from that of good circuits by more than the amount that the ratio could be expected to differ by process variations in the manufacturing process.

In one application, the method of measuring the energy consumed is performed by measuring the average power supply current while the supply voltage is held constant. In another application, an energy test pair of input vectors $V_1$ and $V_2$ are generated so that the percentage transition difference between the good and faulty circuits is maximized as the pair of input vectors is alternated.

In one embodiment the method of selecting an energy test set $E_t$ of input vectors $V_1$ and $V_2$ for practicing the method of claim 3 in connection with a fault on line z involves applying a plurality of first test vectors, determining for each test vector the number of transitions $N_D$ that occur differently in the good and faulty circuits, selecting the first test vector which maximizes $N_D$ and designating it as $D_{max}$, applying a plurality of second test vectors in alternation with $D_{max}$ and the signal at line z alternates in response to the application of the alternating inputs, selecting one of the second test vectors which minimizes the number of transitions that are common to the good and faulty circuits and designating that test vector as $S_v$ and comparing the inputs in $D_{max}$ and $S_v$ to each other and generating energy test vector $E_t$ by setting all inputs which have the same value k in both $D_{max}$ and $S_v$ to k in $E_t$, setting all inputs which have the value 1(0) in $D_{max}$ and (0)1 in $S_v$ to T($\overline{T}$) in $E_t$, setting all inputs which are specified to be a value of k in only one of $D_{max}$ or $S_v$ to k in $E_t$, setting all inputs unspecified in both $D_{max}$ and $S_v$ to 0 and simulating the circuit logic and computing the values of the internal signals using the simulated circuit logic.

This summary is intended to be a general overview of the present test technique and is not intended in a limiting or exclusive sense. The invention described in the detailed description has a scope provided by the attached claims and their equivalents.

DETAILED DESCRIPTION

Figure 1:
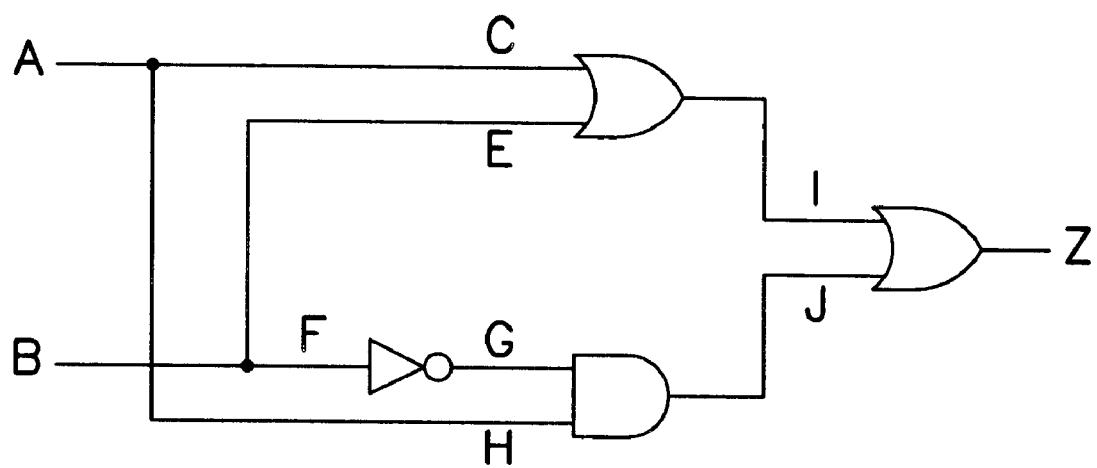
FIG. 1 is a logic diagram of a portion of an electronic circuit.
Figure 2:
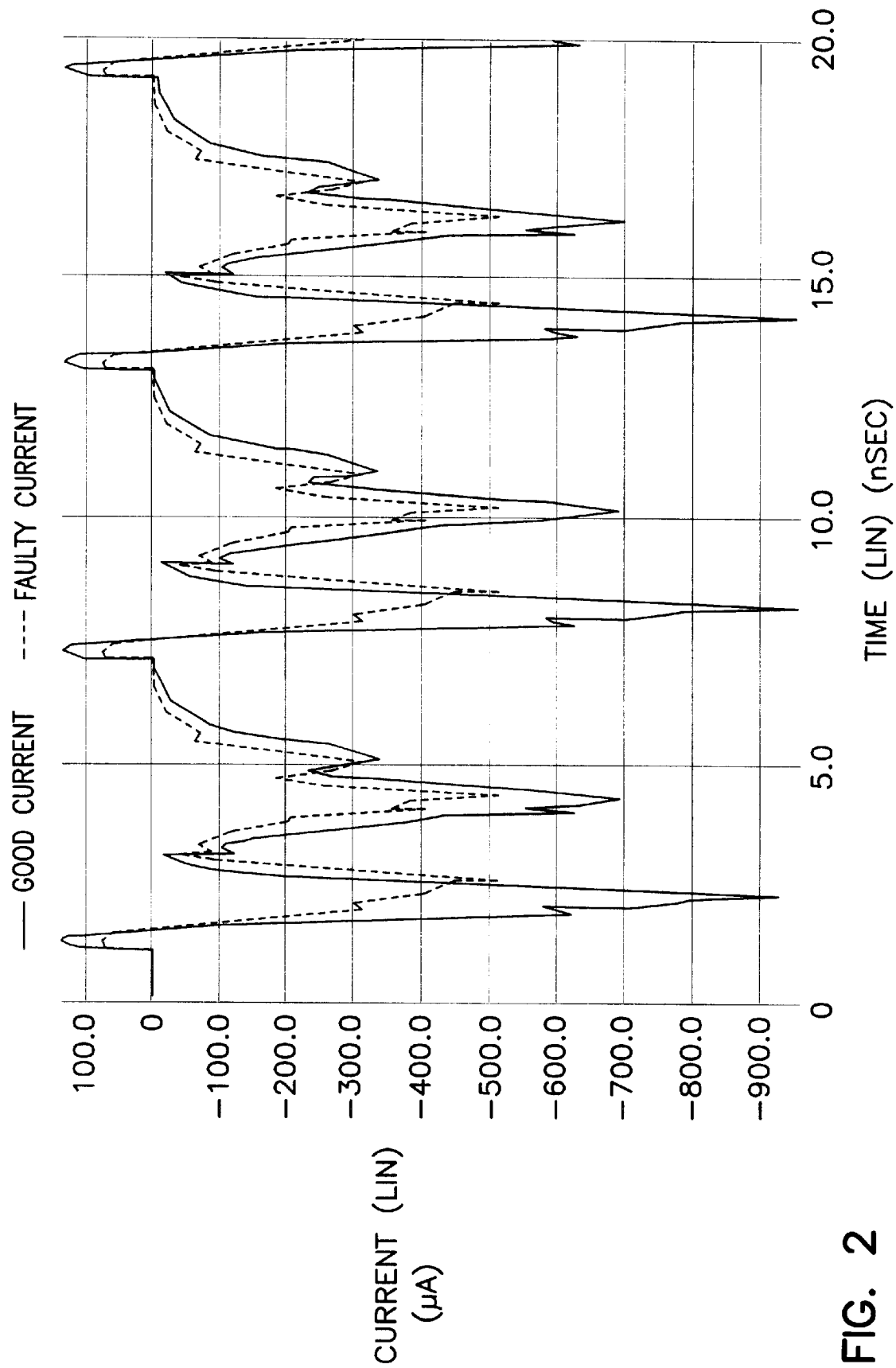
FIG. 2 is a plot showing the supply current consumed by the circuit of FIG. 1 for a good circuit and for a faulty circuit.

Generally, the invention provides a method and apparatus for obtaining identification of electronic circuits containing faults by measuring the energy consumption ratio of the circuit. In one embodiment, this is accomplished by measurement of a pair of supply currents as specific input vectors are applied and by comparing the ratios obtained by that pair of currents for the test circuit to the known ratios when good circuits are tested and allows the flawed circuits to be identified without being subject to errors due to process variations.

If the electronic circuit being tested is a CMOS circuit, it consumes power both when its inputs are static and when they change. With static inputs an ideal circuit should dissipate no power. In practice, leakage currents cause small amounts of static power dissipation.

Dynamic power dissipation occurs when a circuit responds to input changes. There are two components to dynamic power dissipation. At each gate, a change in its output may cause a temporary short circuit path between power and ground which leads to some resistive power dissipation. The second component is the energy needed to charge circuit capacitances on wires that transition from low to high. Usually, capacitor charge currents are the dominant source of energy consumption in CMOS circuits. The energy consumed on a single input transition is $CV^2_{dd}$ where C is the capacitance charged on the transition and $V_{dd}$ is the power supply voltage. Over several input transitions, the average power dissipation is $C_a V^2_{dd} f$, where $C_a$ is the average capacitance charged on each transition, and f is the frequency with which the inputs change. The average supply current is $C_a V_{dd} f$. Given that the capacitor charge currents are the dominant source of energy consumption, on any transition the number of signals that change state can be used as a measure of energy consumption relative to other transitions.

If we consider a "stuck-at" fault F in a circuit C, the fault F may affect one or more steady state internal signal values produced in response to various inputs. That is, one or more steady state internal signal lines will have different values in the good and faulty circuits. The number of signal lines altered by the fault depends upon the input vector. If the differences in signal values can be propagated to the circuit outputs, the fault can be detected.

Any fault that affects steady-state internal signal values also alters the way internal signals transition in response to input changes. That is, a fault alters the number and location of signal changes that occur in response to input changes. For example, the fault may prevent one or more lines from transitioning in response to input changes. Thus, a fault can alter the total capacitance charged during transitions, and alter the energy consumed by the circuit. This change can be detected by monitoring the supply current.

Consider a pair of vectors $V_1$ and $V_2$. Each of the vectors represents a unique configuration of logic signals on a plurality of signal lines which are pertinent to the circuit under test. Assume these two vectors are repeatedly alternated at the inputs to the circuit under test. On the two transitions (from $V_1$ to $V_2$ and vice-versa), let $C_G$ ($C_F$) be the total capacitance charged in the good (faulty) circuit. The difference between the average supply currents in the good and faulty circuits is $|C_G - C_F| V_{dd} f$. In many cases the difference is measurable, even for low input frequencies. We will refer to test pairs of vectors having an appreciable impact upon power dissipation, for a specific fault, as "energy tests".

Relative to the known test techniques discussed above, the power dissipation test offers several advantages. Power dissipation based tests can detect faults that escape detection by other means. They include logically redundant faults and faults that do not affect the static current, for example.

Figure 3:
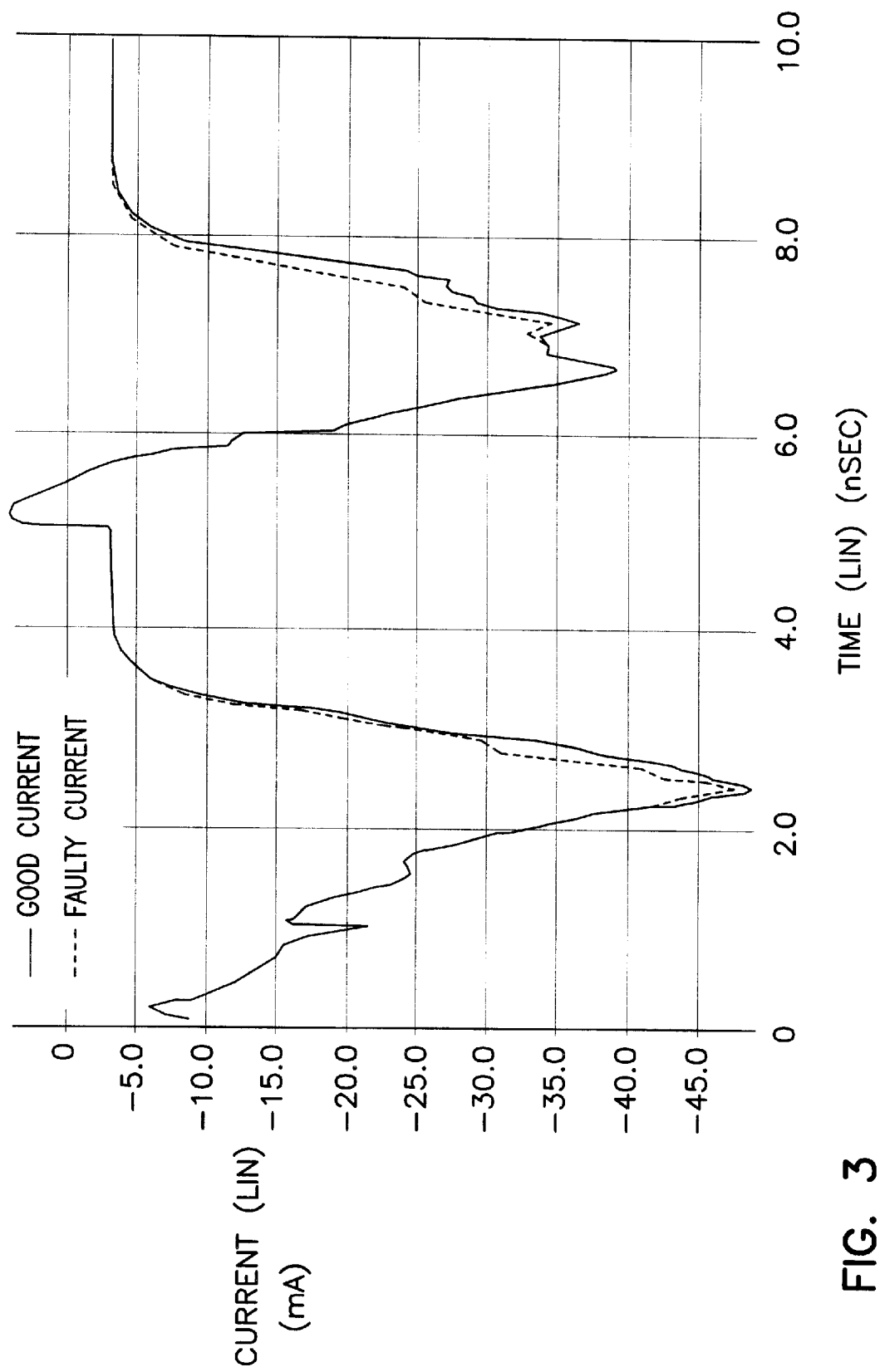
FIG. 3 is a plot showing supply current transients for the good and faulty circuits.

Turning now to the logic circuit illustrated in FIG. 1, consider the operation of the circuit assuming that there is a fault on C which is a "stuck-at" zero. Such a fault is a redundant fault. Consider the vector pair of inputs $V_1$=AB= 00 and $V_2$=AB =10. The particular failure of C would not be seen at the output Z of FIG. 1 if those inputs were applied since the fault is a redundant fault. Although the fault would not be seen at Z the number of transitions in the good circuit would be 5 while the number of transitions undergone in the faulty circuit would be 3. While the plot of FIG. 3 illustrates the fact that the faulty circuit consumes less energy than the good circuit, the difficulty of identifying circuits as good or faulty by comparing plots of current consumption is also illustrated.

Dealing With Process Variations

Unfortunately, a comparison of only the differences in the average supply current is subject to considerable variation due to the variation of circuit parameters caused by normal process variations. Because the process variations lower the discrimination of a test based merely upon a comparison of average supply currents, a more discriminating standard is necessary.

It is well known that due to minor random variations in the device manufacturing process, the true values of device parameters can deviate from their expected nominal values. For example, it is not unusual for the oxide thickness in transistor gates to vary by 5% around its expected nominal value. Consequently, the actual capacitance of a unit sized gate may deviate from its expected value. The power dissipated by the circuit, in general and on specific transitions, may be different from the value expected because of the process variations. In integrated circuits the absolute values of parameters may vary markedly from their nominal values.

Although the absolute values may vary substantially, the matching between on-chip components is likely to be very high. Thus on an IC, a given parameter may not have its nominal value. However it is reasonable to assume that this parameter shifts by almost the same fraction k for all the devices on an IC. For example, process variations will cause the unit gate capacitance to shift by the same factor across an IC. More precisely, the mean of the distribution of values of a particular parameter shifts for an entire IC. The range of values about the mean is very limited. That is, the relative variation of the parameter across the IC is low. In very large ICs, it is possible for relative variations to exist. However, they will be negligible for devices which are physically near one another.

On a specific input transition, the amount of energy consumed is proportional to the total amount of capacitance charged. Let $C_u$ be the gate capacitance of a pair of unit-sized transistors. (Unit-size is defined by the process feature sizes.) Consider again a circuit C with a fault F, and a pair of vectors $P_1=V_1V_2$ alternated as the inputs to the circuit. Let $N_1(N_{1F})$ be the total number of signals that transition on the two input transitions in the good (faulty) circuit. Without the loss of any generality, assume that all transitioning signals drive unit-sized loads. If not, each signal can be weighted by the load it drives. When the two vectors are alternated at the inputs, the average supply current is $N_1C_uV_{dd}f$ in the good circuit, where f is the frequency with which the input changes. In the faulty circuit, the average supply current is $N_{1F}C_uV_{dd}f$. Additionally, in both circuits, there are short circuit and leakage currents which are much smaller. The impact of this fault on the supply current is $(N_1-N_{1F})C_uV_{dd}f$. The percentage transition difference (PTD) is defined as $$PTD = \frac{(N_1 - N_{1F})C_uV_{dd}f}{N_1C_uV_{dd}f} \times 100 = \left(\frac{N_1 - N_{1F}}{N_1}\right) \times 100 \quad (1)$$

Even in the presence of process variations, the functionality and performance of the circuit may be adequate. Consider again the pair of transitions $P_1$. For this pair of vectors, let the range of variation in the average current, in both the good and the faulty circuits, be $\Delta$. That is, the average current of a good IC can be anywhere in the range $N_1C_uV_{dd}f(1\pm\Delta)$. Assume that the faulty circuit consumes less energy than the good circuit for this transition. When actually testing a circuit, it is not known a priori if it is good or faulty. In the worst case, for fault detection to be assured, the maximum current the faulty circuit can sink should be less than the minimum current the good circuit can sink. That is, we need:

$$(1+\Delta)N_{1F}C_uV_{dd}f < (1-\Delta)N_1C_uV_{dd}f \quad (2)$$

$$\Delta(N_{1F}+N_1) < N_1-N_{1F} \quad (3)$$

or $$PTD = \frac{N_1 - N_{1F}}{N_1} \times 100 > \Delta X \times \frac{N_1 + N_{1F}}{N_1} \times 100 \quad (4)$$

The impact of the fault on the average current should be greater than the sum of the variations in the good and faulty currents. The sum of the variations constitutes a detection threshold. Thus, process variations can lower the discrimination of the power dissipation test, and adversely impact fault detection. A similar problem would also be encountered with the $I_{ddq}$ test.

Figure 4B:
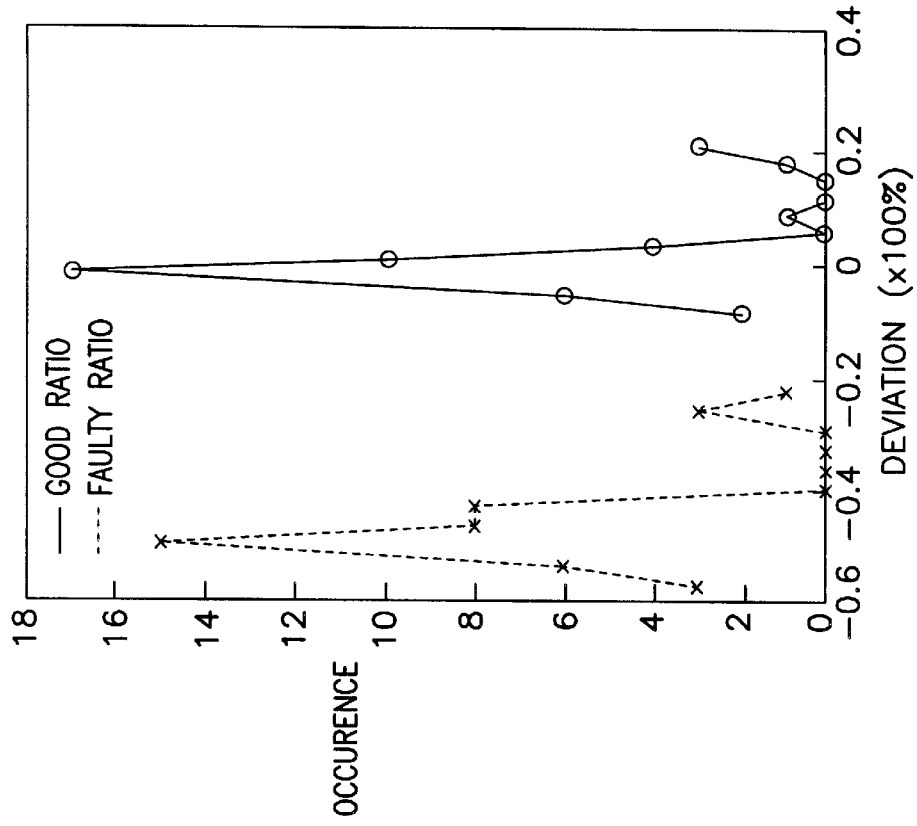
FIG. 4(b) is a plot showing the process tolerance where the energy consumption ratio was used.
Figure 4A:
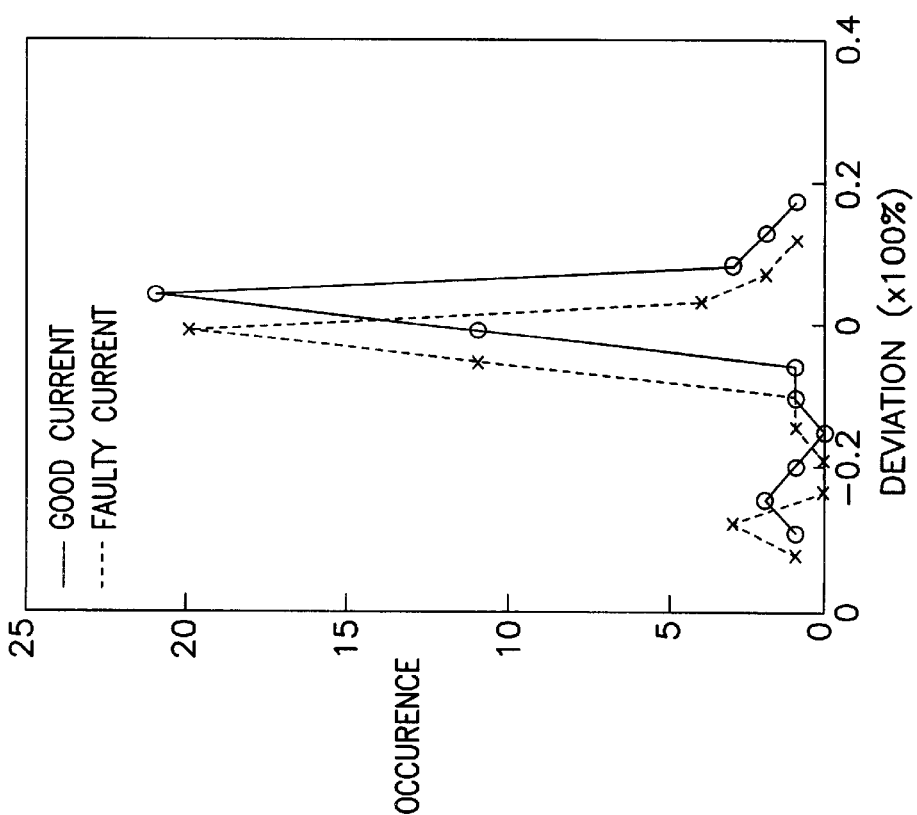
FIG. 4(a) is a plot showing the process tolerance where the average current was tested.

Illustrated in FIG. 4(a) is a distribution of currents measured for a specific circuit with and without a specific redundant fault. The circuit and fault were selected from a standard benchmark circuit containing some 69 redundant faults. For one of the faults, an energy test was generated which maximized the impact of the fault upon energy dissipation. For each of 44 specific process runs simulated from data on logic circuits built under a specific process made available by MOSIS, a facility of the Information Sciences Institute of the University of Southern California, the current consumption in both the good and the faulty circuits was measured.

In FIG. 4(a) the x-axis represents the current consumed and the γ-axis represents the frequency of occurrence. The data in the figure was normalized with respect to the average current consumed in the good, circuit, the 0 point on the x-axis. For a specific process, the average current in the faulty circuit is less than the average current in the good circuit. Unfortunately, the impact of the fault is submerged by the process variations.

The data shown in FIG. 4(a) illustrates the problem with attempting to define a test threshold for the average current. The data was collected on specific simulations of various runs of a circuit manufacturing process in which some 44 runs were made and the results published. Any practical test threshold must lie between the mean current for the good circuits and the mean current for the faulty circuits. Unfortunately, the data illustrates the fact that there would be a high number of process runs where faulty circuits would escape detection and a large number of process runs, where good circuits would be identified as faulty. This data demonstrates the difficulty in trying to use the supply current measurement as the discriminator between good and faulty circuits when there are process variations.

We have discovered that using the energy consumption ratio rather than just the supply current allows removal of much of the uncertainty in measurement that is introduced by normal process variation of good and faulty circuits manufactured using real world processes. Set forth below is an explanation of how the use of the energy consumption ratio "cancels" out some of the masking effects of process variation on the discrimination between good and faulty circuits.

Energy Consumption Ratio

Assume that because of process deviations, the unit gate capacitance of a circuit is $kC_u$. That is, it is altered by a factor of k from its nominal value. Consider again the pair of input vectors $P_1$. For the altered parameters, the average supply current is $I'_{P1}=N_1kC_uV_{dd}f$. The average current also changes by a factor of k. The impact of the fault on the supply current also changes by a factor of k. The detection threshold is determined by the range of values of k, caused by process variations. Next, consider another pair of input vectors $P_2$. Let the total number of transitions in $P_2$ be $N_2$. The average current in the good circuit with nominal circuit parameters is $I_{P2}=N_2C_uV_{dd}f$. The average current with a variation of k is $I'_{P2}=N_2kC_uV_{dd}f$. Assume that the pair $P_2$ is such that it is not affected by the fault. This pair is referred to as the benchmark pair and the corresponding transition is referred to as the benchmark transition. The average current in the good and faulty circuits is the same for the benchmark transition. In a large circuit, the benchmark transition should be chosen so that it exercises roughly the same physical region of the IC.

Consider the ratio of average currents on the two transitions $P_1$ and $P_2$. Let $I_{P1}$ and $I_{P2}$ be the currents on the two transitions. In the circuit with nominal process parameters, the ratio of the currents is:

$$\frac{I_{P1}}{I_{P2}} = \frac{N_1 C_u V_{dd} f}{N_2 C_u V_{dd} f} = \frac{N_1}{N_2} \quad (5)$$

In the presence of process variations that cause the unit gate capacitance to change by a factor of k, the ratio of the currents is:

$$\frac{I'_{P1}}{I'_{P2}} = \frac{N_1 k C_u V_{dd} f}{N_2 k C_u V_{dd} f} = \frac{N_1}{N_2} \quad (6)$$

Similarly, the ratio of the currents in the faulty circuit is:

$$\frac{I_{PIF}}{I_{P2}} = \frac{I'_{PIF}}{I'_{P2}} = \frac{N_{1F}C_u V_{dd} f}{N_2 C_u V_{dd} f} = \frac{N_{1F} k C_u V_{dd} f}{N_2 k C_u V_{dd} f} = \frac{N_{1F}}{N_2} \quad (7)$$

Similar to equation (2) for fault detection with ratio to be guaranteed, we have $$\frac{N_1}{N_2} > \frac{N_{1F}}{N_2} \text{ or} \quad (8)$$

$$\frac{N_1 - N_F}{N_2} > 0 \quad (9)$$

$$\frac{N_1 - N_{1F}}{\left(\frac{N_2/N_1}{N_2}\right)} \times 100 = \left(\frac{N_1 - N_{1F}}{N_1}\right) \times 100 = PTD > 0 \quad (10)$$

The difference in the energy consumption ratios of the good and faulty circuits is also not affected by k. Because the second vector pair $P_2$ is not affected by the fault, the difference is $N_1 - N_{1F}/N_2$. The percentage difference in energy consumption ratio is:

Ideally, the ratio of energies is not altered by process variations but is impacted by a fault and the detection threshold is 0 in accordance with equation (10). In practice, however, the threshold will be greater than 0. The energy consumption ratio reduces the impact of process variations, without reducing the impact of the fault. Essentially, when we compare the energy consumed in two separate transitions, we are ratioing the capacitors charged in those transitions.

A similar technique is used in the design of analog and mixed-signal switched capacitor circuits. Designers utilize the ratio of capacitors, rather than the absolute values, to minimize the impact of process variations. Even for small capacitors, designers expect capacitor ratio mismatches only of the order of 0.5%–1%. It is reasonable to expect similar performance for the energy consumption ratio for our purposes.

If we again consider the redundant fault in the circuit used to generate the data in FIGS. 3 and 4(a), we recall that the monitoring of just the supply current failed to provide good discrimination between good and faulty circuits. In contrast the energy consumption ratio provides extremely good discrimination as shown by the data in FIG. 4(b) which plots the energy consumption ratios in good and faulty circuits. As before, the data is normalized with respect to the average energy consumption ratio in the good circuit. As discussed before, the benchmark transition was chosen such that it was not affected by the fault. The data in FIG. 4(b) shows a much improved situation where there is no overlap between the energy consumption ratios between the good and faulty circuits. The threshold can then be set such that every faulty circuit fails the test and none of the good circuits fail the test!

Determination of Energy Test Vectors

In order to optimize the performance of the test methods using the energy consumption ratio as the discriminant between good and faulty circuits, it is desirable to utilize a pair of vectors $V_1$ and $V_2$ for the inputs that maximize the percentage difference in the number of transitions made by the good and the faulty circuits. Such test sequences are referred to herein as energy tests. Set forth below is a procedure for generating such vectors.

For a pair of vectors $V_1$ and $V_2$ that represent a potential solution, let $N_G$ and $N_F$ be the number of transitions that occur in good and faulty circuits respectively. Let $N_D$ be the number of transitions that occur in the good circuit but not in the faulty circuit. $N_D = N_G - N_F$ is the absolute transition difference. The percentage transition difference (PTD) is:

$$\frac{N_D}{N_G}$$

×100. Ideally, one would like to maximize the percentage transition difference, rather than just the absolute transition difference, to increase the probability of fault detection.

The percentage transition difference is not altered by the use of a reference benchmark transition. Hence, it is assumed below that when referring to an energy test, we are assuming the use of a benchmark transition. Even when searching for only two vectors, energy test generation is a computationally complex problem. For a circuit with n inputs, the search space consists of $2^{2n}$ vectors. Further, given a vector pair, it is difficult to determine if the vector pair causes the maximum percentage transition difference. Fortunately, an energy test need not maximize the PTD. If the impact of the fault is greater than the detection threshold, then the pair is a test. As discussed above, this threshold is determined by the process and measurement characteristics. To reduce the size of the search space, a two-stage test generation process was developed. In carrying out that process the first step is to develop a relationship between static test generation and energy test generation.

Algorithm Development

Static test generation can be shown to be an essential component of energy test generation for "stuck-at" faults. Consider again a fault F=zsai, where I $\epsilon$0,1, and the two potential energy test vectors $V_1$, $V_2$ applied alternately at the inputs. Consider a line I≠z in the circuit. Let L and $L_F$ be the functions realized at line l in the good and faulty circuits respectively. First, consider the case where the value on line l is the same in the good and faulty circuits, for both vectors $V_1$ and $V_2$ That is, $L(V_1)=L_F(V_1)$ and $L(V_2)=L_F(V_2)$. Thus line l is static for both vectors in both circuits, or transitions identically. The capacitance on line l consumes the same amount of energy in both the good and faulty circuits. The more interesting case is the set of lines which contribute to the energy consumption difference between the good and faulty circuits.

A theorem can be postulated as follows:
Given a fault F. and a pair of vectors $V_1$, $V_2$, if line l contributes to the energy difference between the good and faulty circuits, for one of the vectors the fault has to be visible at line l.

The theorem can be proven as follows:
Line l can contribute to the energy difference between good and faulty circuits, when the two vectors are alternated, in one of two ways:
Line l transitions in the good circuit and is static in the faulty circuit. Then, $L(V_1)=k$, $L(V_2)=\bar{k}$. Without the loss of any generality, assume $L_F(V_1)=L_F(V_2)=k$. Consequently, $(L \oplus L_F)(V_2)=1$.
Line l is static in the good circuit and transitions in the faulty circuit. Then, without the loss of any generality, let $L(V_1)=L(V_2)=k$, and $L_F V_1)=k$ and $L_F(V_2)=\bar{k}$. Consequently, $(L \oplus L_F)(V_2)=1$.
That is, the steady state values at line l in the good and faulty circuits will be different.

Given the above, line 1 will have a value of D or $\overline{D}$ for vector $V_2$. Conversely, only lines with a value of D or $\overline{D}$ for $V_2$ can potentially contribute to the energy difference between the good and faulty circuits. This idea is the core of the test generation procedure. Visibility at line 1 does not imply that $V_2$ propagates the effects of the fault to the circuit outputs. However, a test vector for a fault F may be a good candidate to be one of the two vectors in an energy test. Conversely, if a sufficient number of lines transition differently, an energy test pair may detect fault F without propagating it to a primary output. Thus, even if F is logically redundant, it may be possible to set the inputs such that enough D's and $\overline{D}$'s are created to impact the energy consumption.

Figure 5A:
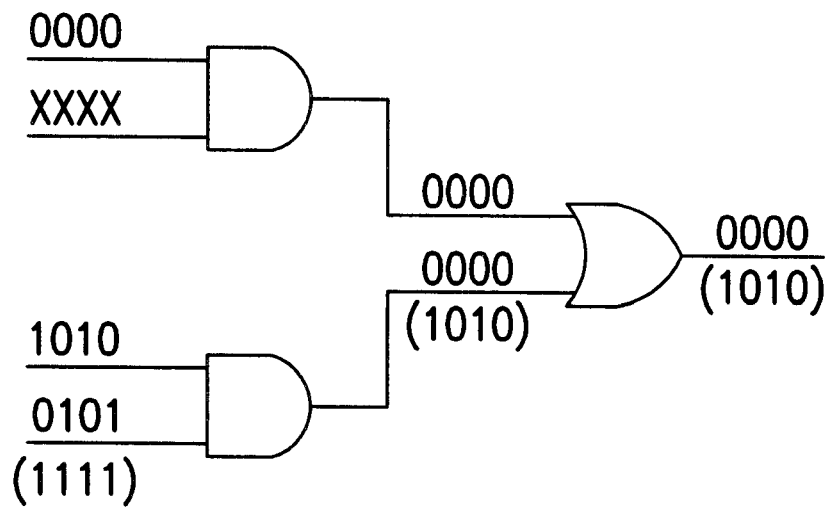
FIG. 5(a) and FIG. 5(b) are examples of circuits for test generation.
Figure 5B:
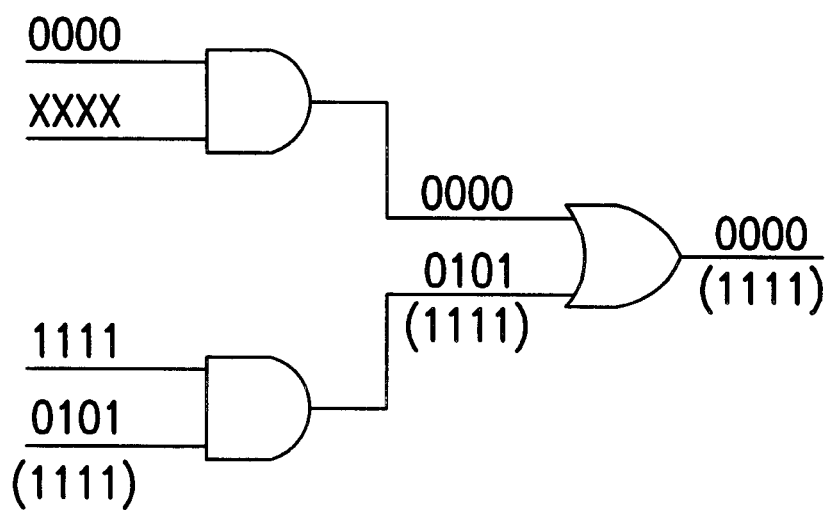

Signals with D's and $\overline{D}$'s are those that transition differently in the good and faulty circuits. The circuits shown in FIGS. 5(a) and 5(b), illustrate two alternative approaches to set the second vector and the remaining inputs. Consider the operation of the circuits with a "stuck-at -1" fault located at the input to the lower AND gate.

In the first approach, shown in FIG. 5(a), in addition to the fault site, a second input also oscillates so as to cancel the first. Thus all signals with D's and $\overline{D}$'s are static in the good circuit and oscillate in the faulty circuit.

In the second approach, shown in FIG. 5(b), the inputs are set such that the site of the fault oscillates. All signals with D's and $\overline{D}$'s oscillate in the good circuit and are static in the faulty circuit. In both approaches the signals in the faulty circuit are shown explicitly in brackets.

The second approach is the one that is preferred because it leads to a greater percentage transition difference both in the example and in general. Additionally, in the first approach, accurate delay models are needed to ensure that glitches do not increase the number of transitions common to the good and faulty circuits.

Test Generation Algorithm

The approach followed reduces the size of the search space from $2^{2n}$ to $2^n$ Briefly, the test generation technique is as follows. The percentage transition difference is maximized indirectly. The first stage maximizes the number of transitions $N_D$ that occur differently in the good and faulty circuits. The goal of the second stage is to maximize the percentage transition difference using the vector generated in stage one. For a fixed $N_D$, the second stage generates the second vector in the energy test so as to minimize the number of transitions common to the good and faulty circuits.

Before discussing the algorithm further, it is necessary to review the algebra used to represent signal values. To represent signals in the good and faulty circuits (for one vector), the common D notation is used. To represent logic values in a circuit for two different vectors $V_1$ and $V_2$ we use a similar notation. The symbol T($\overline{T}$) represents a line with a value of 0(1) for vector $V_1$ and 1(0) for vector $V_2$ Then every signal with a value of D($\overline{D}$) has a value of T ($\overline{T}$). The symbol $T_D(\overline{T}_D)$ represents a line or a signal with a value of T($\overline{T}$) for $V_1$ and $V_2$ and a value of D($\overline{D}$) for $V_1$. The notation is summarized in Table 1 and an exemplary truth table is shown in Table 2.

TABLE 2

Signal representation over two vectors

| Value | $V_1$ | $V_2$ |
|---|---|---|
| 0 | 0 | 0 |
| 1 | 1 | 1 |
| T | 0 | 1 |
| $\overline{T}$ | 1 | 0 |

TABLE 3

Example truth table for an OR gate

| OR | 0 | 1 | T | $\overline{T}$ | $T_D$ | $\overline{T}_D$ |
|---|---|---|---|---|---|---|
| 0 | 0 | 1 | T | $\overline{T}$ | $T_D$ | $\overline{T}_D$ |
| 1 | 1 | 1 | 1 | 1 | 1 | 1 |
| T | T | 1 | T | 1 | 1 | $T_D$ |
| $\overline{T}$ | $\overline{T}$ | 1 | 1 | $\overline{T}$ | $\overline{T}_D$ | 1 |
| $T_D$ | $T_D$ | 1 | $T_D$ | $\overline{T}_D$ | 1 | $T_D$ |
| $\overline{T}_D$ | $\overline{T}_D$ | 1 | 1 | $\overline{T}_D$ | $T_D$ | 1 |

Static Test Generation

The first step in generating an energy test pair is a static test generation procedure. Only those lines with a value of D or $\overline{D}$ can oscillate differently in the good and faulty circuits. The first stage uses an implicit enumeration based search procedure which is used to identify a vector that maximizes $N_D$. It is particularly desired to focus on those faults that escape other testing methods. Hence, if a static test is found as the procedure is carried out, the energy test generation algorithm terminates. However, if the fault is redundant the first stage returns a vector that maximizes the number of D's and $\overline{D}$'s in the circuit. That vector is referred to as the $D_{max}$ vector. The procedure maximizes the number of D's by setting as few inputs as possible to specific values. Thus one or more inputs may be set to unknown values in the $D_{max}$ vector. This also implies that no vector that further propagates the D's and $\overline{D}$'s exists. The $D_{max}$ vector is the first vector in the energy test pair.

Generating a Transition Vector

The second stage of the procedure generates the energy test pair. The first step is to identify a second transition vector $S_v$ such that when the vectors $D_{max}$ and $S_v$ are alternated at the input:

The site of the fault, line z oscillates.

The number of transitions common to both circuits is minimized

Recall that the target fault is zsai. Thus, the vector $D_{max}$ sets line z to $\overline{1}$. Correspondingly, the vector $S_v$ has to set line z to 1. Again a PODEM-based procedure is used to accomplish this. Both the vectors $D_{max}$ and $S_v$ may have unknown inputs.

Energy Test Formulation

An energy test vector $E_t$ that simultaneously represents signal values in the good circuit for both vectors $D_{max}$ and $S_v$ is generated as follows:

All inputs which have the same value k in both $D_{max}$ and $S_v$ are set to k in $E_t$.

All inputs which have a value of 1(0) in $D_{max}$ and 0(1) in $S_v$ are set to T($\overline{T}$) in $E_t$.

All inputs specified to have the value k in only one of $D_{max}$ or $S_v$ are set to k in $E_t$.

All inputs unspecified in both $D_{max}$ and $S_v$ are set to 0. The vector $E_t$ represents signal values in the good circuit for both the vectors in an energy test. Once $E_t$ is computed logic simulation is used to compute the signal values of internal signals. Beyond the site of the fault, there may be some signals which have a value of both T and D (or $\bar{D}$) in $D_{max}$. Such signals on those lines are altered to $T_D$ or $\bar{T}_D$ as is appropriate.

Reducing Common Transitions

At this stage, the energy test pair will still contain unspecified inputs. The signals labeled $T_D$ or ($\bar{T}_D$) will transition differently in the good and faulty circuits. Let the T-set be the set of signals with a value of T or $\bar{T}$. The signals in the T-set will transition in both the good and faulty circuits. The greater the number of T's the lower the relative impact of the fault on the energy consumption. Any remaining unspecified inputs are set such that the number of T's and $\bar{T}$'s is minimized as follows. A gate g is on the T-frontier if: (1) its input has value x; (2) one or more of its inputs has a value T or $\bar{T}$. The T-frontier is very similar to the D-frontier used in test generation. The remaining unspecified inputs are set such that the T-frontier=Ø while minimizing the size of the T-set. This minimizes the number of transitions that are common to both the good and faulty circuits.

Solution Evaluation

Once the T-frontier has been eliminated, the next step is to evaluate the quality of the solutions generated. Both the good and the faulty circuits are logically simulated with vectors in the potential energy test pair. The actual vectors can be trivially extracted from the energy test pair. The observability is declared on the percentage transition difference (PTD) (the difference of the transient currents of the power supply) between the good and the faulty circuit. If the PTD is greater than the threshold for detection, the fault is declared as having been detected. Benchmark transitions can be generated using an algorithm very similar to the energy test generation algorithm.

Test Apparatus

Figure 6:
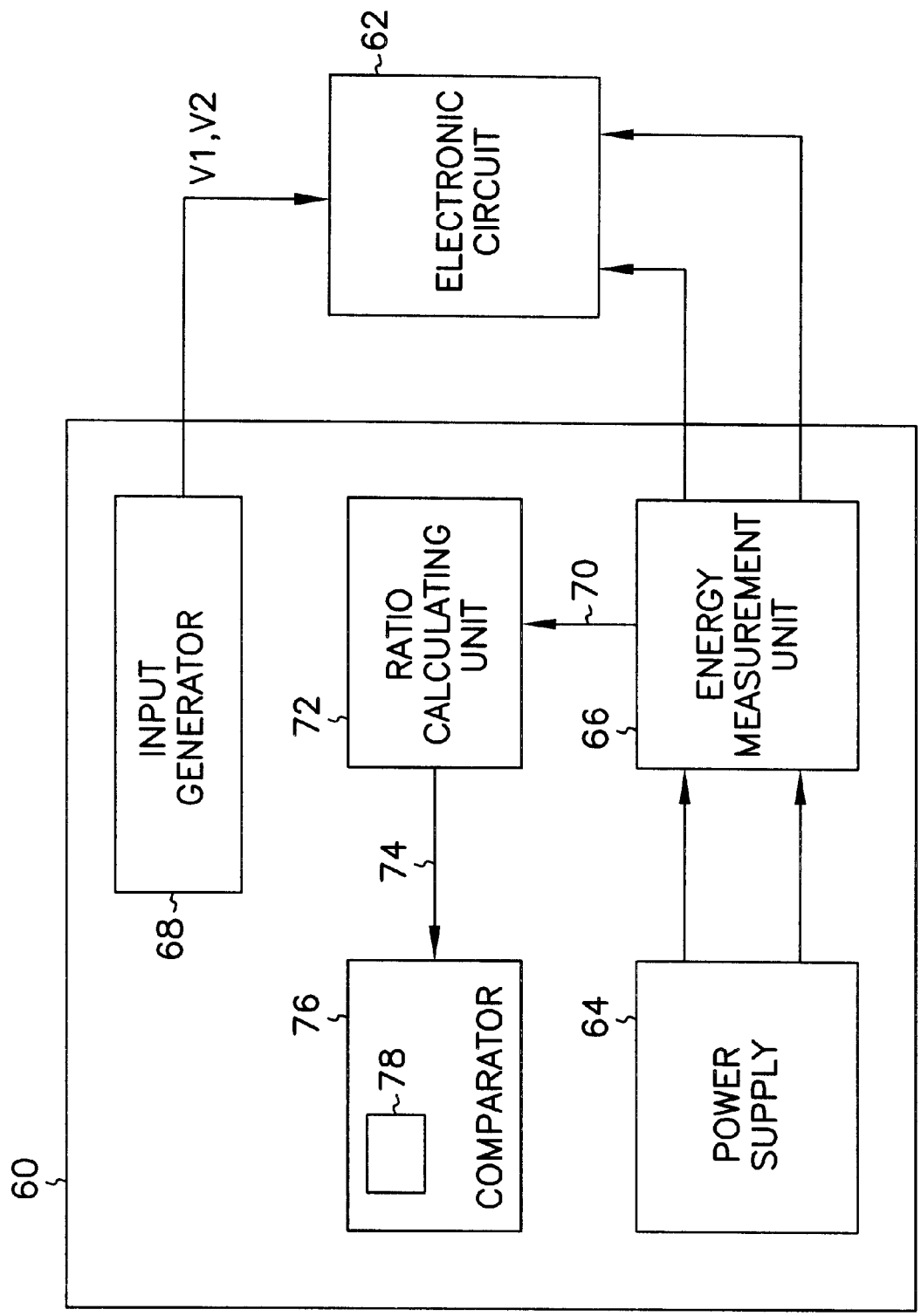
FIG. 6 is a block diagram of an embodiment of the invention.

FIG. 6 is a block diagram of an embodiment of apparatus 60 for testing an electronic circuit 62 by measuring its energy consumption and using the ratio of that energy consumption to the energy consumption of a benchmark transition as a good versus faulty indicator.

The test apparatus 60 is comprised of a power supply unit 64 which is operatively coupled to provide input power to circuit 62 to the usual power terminals of the circuit. In the test apparatus 60 shown, an energy measurement unit 66 measures the average energy delivered to circuit 62 as the testing is performed and produces an output signal 70 representing the average energy consumption of circuit 62. Since the average energy is equivalent to the power delivered, it can be seen that the power can be measured by tracking the value of the input current over time, provided the input voltage to circuit 62 is held constant.

In order to calculate the energy consumption ratio of circuit 62, it is necessary for the input generator 68 to drive the inputs of the circuit with alternating input vectors $V_1$ and $V_2$, where each vector represents a particular sequence of input signals. If, for example, there are eight signals that may be input to circuit 62 to logic input terminals or to separate test points within larger circuits, vectors $V_1$ and $V_2$ represent two distinct combinations of those inputs. While repeating the testing for all possible combinations of $V_1$ and $V_2$ is certainly one way to perform the testing, doing so is not necessary when $V_1$ and $V_2$ are selected so as to maximize the energy consumption difference for the transitions between $V_1$ and $V_2$. In the section above entitled "Determination of Energy Test Vectors", and subsequent sections, a rationale is given for selection of vectors $V_1$ and $V_2$ which are most likely to identify faulty circuits with a minimum of tests using different vectors being necessary.

A ratio calculating unit 72 is operatively coupled to energy measurement unit 66 to receive the output signal 70 therefrom. Ratio calculating unit 72 is constructed and arranged to calculate the ratio of the measured energy consumption on the energy test of the test circuit 62 to the energy to be consumed on the benchmark transition. In actual practice, it may be that test data is available on a large number of good units so that the energy consumption ratio of good circuits may be closely characterized. In other cases it may be possible to calculate what the expected energy consumption ratio would be based upon a computer model of a good circuit. In any event, an output signal 74 is produced which represents the calculated energy consumption ratio.

A comparator unit 76 is operatively coupled to the ratio calculating unit 72 to receive output signal 74. Comparator unit 76 computes the deviation for the energy consumption ratio. In one embodiment when the energy consumption ratio of test circuit 62 differs from the ratio for good circuits by a predetermined amount, and indicator 78 may be enabled to indicate that the circuit under test is faulty. For example, if comparator unit 76 calculates the deviation of the measured energy consumption ratio of the test circuit, faulty circuits are determined to be those whose ratios are more than three standard deviations from the expected ratio for the good circuit.

It must be realized that the apparatus described above and in FIG. 6 may be implemented in a number of embodiments without departing from the present invention. For example, it is entirely within the scope of our invention to have portions or all of the energy measurement unit 66, the ratio calculating unit 72 and the comparator unit 74 realized in a programmed general purpose computer for carrying out the necessary measurements and calculations. Alternatively, the same functions can also be realized using specific "hard-wired" circuitry while still following the present invention.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed:

1. A method of fault testing an electronic circuit comprising:
   selecting an optimized pair of input vectors $V_1$ and $V_2$ for alternating input to a logic circuit to maximize the difference in energy consumption between good circuits and faulty circuits and wherein the optimized pair of input vectors $V_1$ and $V_2$ are applied to a logic circuit where a specific fault is present and a corresponding good circuit, and the method of selecting the optimized pair of input vectors comprises:
   determining the amount of supply current transitions that occur in the good circuit in response to a pair of input vectors;
   determining the amount of transitions that occur in the faulty circuit in response to the same pair of input vectors;

determining the amount of transitions of supply current that are common to the good and the faulty circuit in response to the same pair of input vectors;

calculating the percentage transition difference for each pair of input, vectors;

repeating the above steps for other selected pairs of input vectors until all possible input vectors have been used; and selecting as the optimized pair of input vectors for that fault, the pair of input vectors which maximizes the calculated percentage transition difference for that fault;

connecting the circuit to a power supply;

applying the optimized input vectors $V_1$ and $V_2$ as inputs to the circuit repeatedly In alternation as an energy test;

measuring the average energy consumed by the circuit in undergoing repetitive transitions between $V_1$ and $V_2$;

calculating the consumption ratio of the measured energy consumed on the energy test by the circuit being tested to the energy consumed on a benchmark transition; and identifying the circuit being tested as faulty where its consumption ratio differs from that of good circuits by more than the amount that the ratio could be expected to differ by process variations in the manufacturing process.

2. The method of claim 1 wherein the inputs vectors $V_1$ and $V_2$ alternate at a frequency f.

3. The method of claim 1 wherein the standard variation of the consumption ratio is calculated and the circuit is identified as faulty where the magnitude of the deviation of the measured consumption ratio of the circuit under test to the consumption ratio of good circuits exceeds a predetermined threshold.

4. The method of claim 3 wherein the test circuit is determined to be faulty where its consumption ratio differs from the expected value of good circuits by more than three standard deviations.

5. The method of claim 1 wherein the step of measuring the energy consumed is performed by measuring the average power supply current while the supply voltage is held constant.

6. The method of claim 1 wherein input vectors $D_{max}$ and $S_v$ are selected for maximizing the energy consumption difference between good circuits and circuits containing a specific fault, the selection method comprising:

applying a plurality of first input vectors;

determining for each first input vector $V_1$ the number of transitions $N_D$ that occur differently in the good and faulty circuits;

selecting a value for vector $V_1$ which maximizes $N_D$ and designating it as $D_{max}$;

applying a plurality of second input vectors $V_2$ in alternation with $D_{max}$; and selecting one of the second input vectors $V_2$ which minimizes the number of transitions that are common to the good circuits and circuits containing the specific fault and designating that input vector as $S_v$.

7. The method of claim 6 wherein unspecified inputs remaining in $D_{max}$ and $S_v$ are set to specific values to minimize the number of transitions that are common to a good circuit and a circuit containing the specific fault when $D_{max}$ and $S_v$ are applied.

8. The method in claim 7 wherein further processing of vectors $D_{max}$ and $S_v$ occurs for selecting an energy test set $E_t$ of input vectors $V_1$ and $V_2$ which simultaneously represents signal values in the good circuit for both vectors $D_{max}$ and $S_v$, comprising:

comparing the inputs in $D_{max}$ and $S_v$ to each other and generating energy test vector $E_t$ by setting all inputs which have the same value k in both $D_{max}$ and $S_v$ to k in $E_t$;

setting all inputs which have the value 1(0) in $D_{max}$ and (0)1 in $S_v$ to $T(\overline{T})$ in $E_t$;

setting all inputs which are specified to be a value of k in only one of $D_{max}$ or $S_v$ to k in $E_t$; and setting all inputs unspecified in both $D_{max}$ and $S_v$ to 0.

9. The method of claim 8 wherein logic simulation is used to compute the values of the internal signals in the circuit using simulated circuit logic and for points in the circuit beyond the site of the fault altering those signals having a value of $T(\overline{T})$ or D (or $\overline{D}$) in $D_{max}$ to $T_D$ or $\overline{T}_D$ as is appropriate.

10. The method of claims 6 wherein the method of selecting D comprises performing an implicit enumeration based search procedure to identify the vector that maximizes $N_D$.

11. The method of claim 6 wherein the application of test signals is terminated if the fault being evaluated can be identified by a static test at a circuit output.

12. The method of claim 6 wherein the method of selecting $S_v$ comprises performing an implicit enumeration based search procedure to identify the vector that minimizes the transitions that are common in the good and faulty circuits.

13. The method of selecting an energy test set $E_t$ of input vectors $V_1$ and $V_2$ for practicing the method of claim 1 in connection with a fault on line z of a logic circuit, comprising:

applying a plurality of first test vectors;

determining for each test vector the number of transitions $N_D$ that occur differently in the good and faulty circuits;

selecting the first test vector which maximizes $N_D$ and designating it as $D_{max}$;

applying a plurality of second test vectors in alternation with $D_{max}$ and the signal at line z alternates in response to the application of the alternating inputs;

selecting a one of the second test vectors which minimizes the number of transitions $N_c$ that are common to the good and faulty circuits and designating that test vector as $S_v$;

comparing the inputs in $D_{max}$ and $S_v$ to each other and generating energy test vector $E_t$ by, setting all inputs which have the same value k in both $D_{max}$ and $S_v$ to k in $E_t$;

setting all inputs which have the value 1(0) in $D_{max}$ and (0)1 in $S_v$ to $T(\overline{T})$ in $E_t$;

setting all inputs which are specified to be a value of k in only one of $D_{max}$ or $S_v$ to k in $E_t$;

setting all inputs unspecified in both $D_{max}$ and $S_v$ to x.; and simulating the logic circuit and computing the values of the internal signals using a simulated logic circuit.

14. The method of claim 13 wherein unspecified inputs remaining in the energy test pair are set to minimize the number of transitions that are common to the good and faulty circuits.

15. A method of selecting an optimized test set of input vectors $V_1$ and $V_2$ for alternating application to a logic circuit to be tested for a specifically defined fault F to maximize the change in the average power supply current delivered to a circuit where the fault is present and a good circuit where both are driven by the same vectors, the method comprising:

determining the number of transitions that occur in the good circuit in response to a pair of input vectors;

determining the number of transitions that occur in the faulty circuit in response to the same pair of input vectors;

determining the number of transitions that are common to the good and the faulty circuit in response to the same pair of input vectors;

calculating the percentage transition difference for each pair of input vectors;

repeating the above steps for other pairs input vectors until all possible input vectors have been used; and selecting as the optimized test set of input vectors for that fault, the vector pair which maximizes the calculated percentage transition difference for that fault.

16. A method of selecting input vectors $D_{max}$ and $S_v$ for maximizing the energy consumption difference between good circuits and circuits containing a specific fault, comprising:

applying a plurality of first input vectors;

determining for each input vector the number of transitions $N_D$ that occur differently in the good and faulty circuits;

selecting the first input vector which maximizes $N_D$ and designating it as $D_{max}$;

applying a plurality of second input vectors in alternation with $D_{max}$ and the signal at line z alternates in response to the application of the alternating inputs; and selecting a one of the second input vectors which minimizes the number of transitions $N_c$ that are common to the good and faulty circuits and designating that input vector as $S_v$.

17. The method of claim 16 wherein unspecified inputs remaining in $D_{max}$ and $S_v$ are set to minimize the number of transitions that are common to a good circuit and a circuits containing the specific fault when $D_{max}$ and $S_v$ are applied.

18. The method of claim 17 wherein further processing of vectors $D_{max}$ and $S_v$ occurs for selecting an energy test set $E_t$ of input vectors $V_1$ and $V_2$ which simultaneously represents signal values in the good circuit for both vectors $D_{max}$ and $S_v$, comprising:

comparing the inputs in $D_{max}$ and $S_v$ to each other and generating energy test vector $E_t$ by:

setting all inputs which have the same value k in both $D_{max}$ and $S_v$ to k in $E_t$;

setting all inputs which have the value 1(0) in $D_{max}$ and (0)1 in $S_v$ to T($\overline{T}$) in $E_t$;

setting all inputs which are specified to be a value of k in only one of $D_{max}$ or $S_v$ to k in $E_t$; and setting all inputs unspecified in both $D_{max}$ and $S_v$ to x.

19. The method of claim 18 wherein logic simulation is used to compute the values of the internal signals in the circuital signals using the simulated circuit logic and for points in the circuit beyond the site of the fault altering those signals having a value of T or D (or $\overline{D}$) in $D_{max}$ to $T_D$ or $\overline{T}_D$ as is appropriate.

20. A method of selecting an energy test set $E_t$ of input vectors $V_1$ and $V_2$ for measuring the energy consumption of a circuit having a fault on line z of a logic circuit and comparing it to the average energy consumption of and otherwise corresponding circuit without the fault, comprising:

applying a plurality of first test vectors;

determining for each test vector the number of transitions $N_D$ that occur differently in the good and faulty circuits;

selecting the first test vector which maximizes $N_D$ and designating it as $D_{max}$;

applying a plurality of second test vectors in alternation with $D_{max}$ and the signal at line z alternates in response to the application of the alternating inputs;

selecting a one of the second test vectors which minimizes the number of transitions $N_c$ that are common to the good and faulty circuits and designating that test vector as $S_v$;

comparing the inputs in $D_{max}$ and $S_v$ to each other and generating an energy test vector $E_t$ by setting all inputs which have the same value k in both $D_{max}$ and $S_v$ to k in $E_t$;

setting all inputs which have the value 1(0) in $D_{max}$ and (0)1 in $S_v$ to T($\overline{T}$) in $E_t$;

setting all inputs which are specified to be a value of k in only one of $D_{max}$ or $S_v$ to k in $E_t$;

setting all inputs unspecified in both $D_{max}$ and $S_v$ to x; and simulating the circuit logic and computing the values of the internal signals using the simulated logic circuit.

21. The method of claim 20 wherein unspecified inputs remaining in the energy test pair are set to minimize the number of transitions that are common to the good circuit and the circuit with the fault when the energy test pair is applied.

22. The method of claim 21 wherein unspecified inputs remaining in the energy test pair are set to minimize the number of transitions that are common to the good circuit and the circuit with the fault when the energy test pair is applied.

23. The method of claim 20 wherein the method of selecting $P_{max}$ comprises performing an implicit enumeration based search procedure to identify the vector that maximizes $N_D$.

24. The method of claim 20 wherein the application of test signals is terminated if the fault being evaluated can be identified by a static test at a circuit output.

25. The method of claim 20 wherein the method of selecting $S_v$ comprises performing an implicit enumeration based search procedure to identify the vector that minimizes $N_C$.

\* \* \* \* \*

UNITED STATES PATENT AND TRADEMARK OFFICE
CERTIFICATE OF CORRECTION

PATENT NO.    : 6,513,137 B1                                             Page 1 of 1
DATED         : January 28, 2003
INVENTOR(S)   : J. M. Cortner, Bapiraju Vinnakota and Wanli Jiang It is certified that error appears in the above-identified patent and that said Letters Patent is hereby corrected as shown below:

Column 1,
Line 4, delete "this" and insert -- This -- therefor.

Column 13,
Line 5, delete "," after "input".
Line 15, delete "In" and insert -- in -- therefor.

Column 14,
Line 19, delete "claims" and insert -- claim -- therefor.

Column 16,
Line 26, insert -- : -- after "by".

Signed and Sealed this

Twenty-sixth Day of August, 2003

JAMES E. ROGAN
*Director of the United States Patent and Trademark Office*